United States Patent
Hoffman

[11] 4,059,811
[45] Nov. 22, 1977

[54] INTEGRATED CIRCUIT AMPLIFIER
[75] Inventor: Charles Reeves Hoffman, Raleigh, N.C.
[73] Assignee: International Business Machines Corporation, Armonk, N.Y.
[21] Appl. No.: 752,958
[22] Filed: Dec. 20, 1976
[51] Int. Cl.[2] ............................................. H03F 3/16
[52] U.S. Cl. ................................... 330/277; 330/293
[58] Field of Search .................. 330/28, 35, 38 M, 85

[56] References Cited
U.S. PATENT DOCUMENTS

| 3,265,981 | 8/1966 | Dill | 330/35 X |
| 3,678,407 | 7/1972 | Ahrons | 330/35 |

*Primary Examiner*—James B. Mullins
*Attorney, Agent, or Firm*—Delbert C. Thomas

[57] ABSTRACT

In the application of analog type circuits to semiconductor chips for large scale circuit integration, a substantial improvement in the size of an amplifier circuit on the chip can be obtained by use of only active components on the chip. The described circuit is designed for any desired amplification factor and this factor can be maintained substantially uniform from chip to chip despite wide variations in the characteristics of comparable components between different semiconductive chips. The analog amplifier includes a high gain operating amplifier and a feedback-input circuit having only active components and which can be designed to reduce the gain of the operating amplifier to any desired value.

1 Claim, 2 Drawing Figures

INTEGRATED CIRCUIT AMPLIFIER

This invention relates to amplifier circuits for incorporation in solid state circuits and, more particularly, to such circuits which may be designed to have a desired gain which will be uniform for all chips of a production run.

The use of resistive negative feedback with a high gain amplifier to provide a designed overall gain which is stable and does not vary with the parameters of the components is conventional with circuits having discrete components. A direct application of such circuits to integrated circuits on semiconductor chips is, however, not satisfactory. The required resistors take up an inordinate area of the chip and generate a large heat loss. Also, the use of the feedback resistors involves both a low impedance input and a current drain from the amplifier output, both factors calling for larger, higher power, active components each of which takes more chip area than normal components.

It is desirable to have an amplifier circuit which can be designed to have a preset gain over a wide range of production parameters, has a very high input impedance and uses low power components so that it requires only a small chip area for its implementation.

It is then an object of this invention to provide an amplifier circuit for an integrated circuit chip, the circuit requiring no passive impedances or large power generating components and hence needing only a small chip area.

It is another object to provide an amplifier circuit of field effect transistors of the metal-oxide-semiconductor type (MOSFET) which will occupy a small chip area and which can be designed to have a preset gain despite wide variations in process related parameters between different chips.

A further object is to develop an amplifier circuit in MOSFET technology which has a preset gain that is independent of processing variables.

Still another object is to develop such an amplifier which presents a very high impedance to an input circuit and has no appreciable output drain for a feedback circuit whereby the circuit may be formed of minimal size components.

Other objects will be set out or will be obvious from the following description of a preferred embodiment of the invention and from the appended drawings.

The use of negative feedback with a high gain amplifier to achieve a stable and precise overall circuit gain is conventional in electronic circuitry. For frequency independence and linearity, the negative feedback will be provided by resistors and the gain can be set by the ratio between the feedback resistance and one in the input circuit. Any desired ratio can be easily obtained so the circuit gain can be set quite closely.

In integrated circuit design on silicon semiconductor chips, resistors require an inordinate area of the chip. Also, the current drain through the feedback resistor requires that the output stage of the amplifier be designed to provide power which means a larger chip area for the output components. The disclosed circuit provides feedback by the use of active FET's rather than resistors and can be applied to a chip without wasted area.

Figure 2:
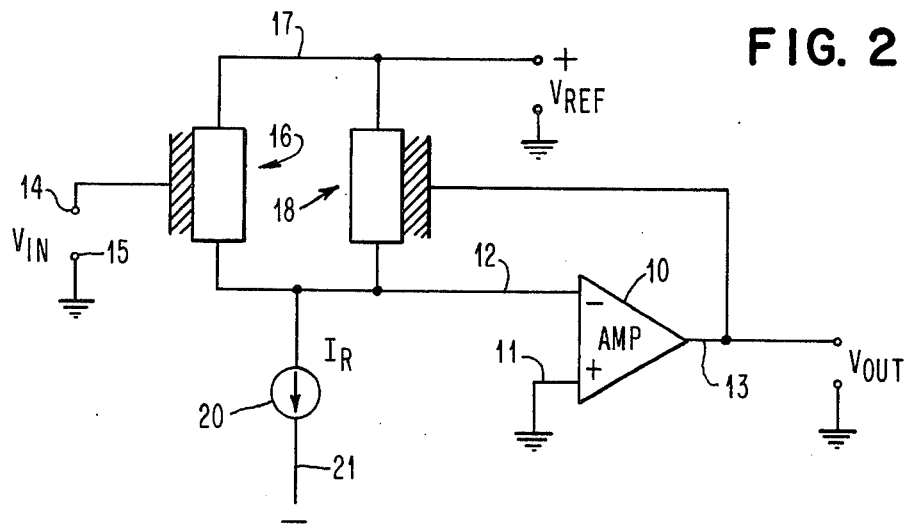
FIG. 2 is a diagram showing the preferred embodiment of the amplifier of this invention.

In the circuit of FIG. 2, the amplifier 10 may be any conventional design-operational amplifier. It may have a very high gain between input and output, e.g., a gain of 1,000 or more, but the gain need not be precisely set and need not be linear. Both factors can vary with manufacturing conditions. Amplifier 10 has two inputs, a lower one 11 which is connected to a ground or reference level voltage and an upper one 12 which is connected to an input signal and is an inverting input with respect to the amplifier output 13.

An input signal is applied to input terminals 14 and 15 which are connected to the gate of an FET 16 and to ground respectively. FET 16 has its drain connected to the plus side 17 of a voltage source and has its source connected to input 12 of amplifier 10. A second FET 18 is connected in parallel to FET 16 with its drain also connected to the positive side 17 of the voltage source and its source connected to amplifier input 12 but its gate is connected to output 13 of amplifier 10. The sources of both FET's 16 and 18 and input 12 are connected through a constant current regulator 20 to the negative side 21 of the voltage source. Both FET's are preferably of the depletion type which will be normally conductive when the gate and source are at the same voltage. As is usual in FET's, the gate impedance of FET 16 is very high so that there is no requirement for input current and the amplifier is well suited for no-load applications such as sample and hold circuits.

In operation, the current through regulator 20 and the voltage of the supply are adjusted with inputs 11 and 14 at ground level until the voltage at amplifier input 12 is at the same level as the voltage at input 11 or is at a virtual ground level. Amplifier output 13 will then also be at a ground level so that the gate of FET 18 is also at ground. Both FET's 16 and 18 are to be operating in their linear operating region.

Any increase in the input voltage at terminal 14 will cause FET 16 to exhibit a reduced resistance and, therefore, a lower voltage drop so that the voltage of input 12 becomes positive. This positive voltage at input 12 is amplified in amplifier 10 and inverted to generate a negative voltage on output 13 which is applied to the gate of FET 18 to increase its effective resistance. The voltage at the gate of FET 18 will be such that there is little overall change in the net resistance of the combination of FET's 16 and 18 and hence the voltage change at input 12 will be negligible so that input 12 is always at a virtual ground level. The output voltage of amplifier 10 will always be inversely related to the input voltage on terminal 14 by a ratio depending upon the relationship to the design parameters of FET's 16 and 18.

Figure 1:
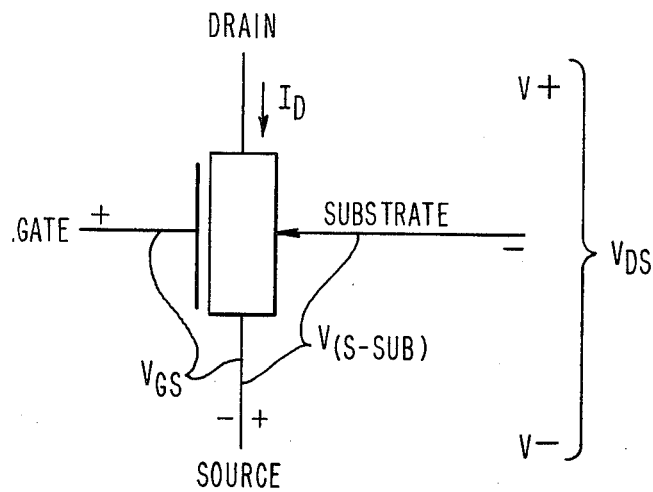
FIG. 1 is a schematic diagram of a field effect transistor and the designation of the operating parameters thereof.

To understand the relationship of the parameters to be used in the development of FET's 16 and 18, it is desirable to consider the mathematical description of the transistors with reference to FIG. 1. The drain current $I_D$ for the linear region is given by the relationship $$I_D = \mu C(W/L)(V_{GS} - V_T - V_{DS}/2)v_{DS}$$

for $$V_{GS} > V_T$$

and $$V_{DS} < (V_{GS} - V_T)$$

where $\mu$ is the effective mobility of channel electrons,
$C$ is the gate capacitance per CM$^2$,
$(W/L)$ is the effective width-to-length ratio of the FET channel,
$V_{GS}$ is the gate voltage with respect to the source voltage,
$V_T$ is the threshold voltage for FET conduction, and
$V_{DS}$ is the drain-to-source voltage of the FET.

In the case of depletion FET's such as FET's 16 and 18

$$V_T = K_1 + K_2(V_{S\text{-}SUB} + \psi)^{\frac{1}{2}} + K_3(V_{S\text{-}SUB} + \psi)$$

$K_1$, $K_2$, and $K_3$ are process-dependent constants, and $\psi$ is twice the Fermi level As we have assumed that amplifier 10 has sufficient gain to make input 12 a virtual ground, we can write the current equations for FET's 16 and 18 as $$I_{16} = 2\lambda_{16}(V_{IN} - V_{T16} - V_{REF}/2) V_{REF} \qquad 1$$

where
$V_{REF}$ = the drain voltage 17 with respect to ground, and $$V_{REF} \leq (V_{IN} - V_{T16}), \qquad \text{1-A}$$

thus insuring operation in the linear region, and $$\lambda_{16} = \tfrac{1}{2}\mu\, C(W/L)_{16} \qquad \text{1-B}$$

$$I_{18} = 2\lambda_{18}(V_{OUT} - V_{T18} - V_{REF}/2) V_{REF} \qquad 2$$

where
$$V_{REF} \leq (V_{OUT} - V_{T18}) \text{ and} \qquad \text{2-A}$$

$$\lambda_{18} = \tfrac{1}{2}\mu\, C(W/L)_{18} \qquad \text{2-B}$$

Equations (1-A) and (2-A) serve as the limiting equation for the range of input and output voltage swings, typical values of $V_T$ are about $-1.74$ volts for long channel devices, i.e., those where $L$ is in the neighborhood of 0.0005 inches.

Now differentiate the equations for $I_{16}$ and $I_{18}$ with respect to $V_{IN}$, noting that since the source node is a virtual ground, the $V_T$'s are constants $$\delta I_{16}/\delta V_{IN} = 2\lambda_{16} V_{REF} \text{ and} \qquad 3$$

$$\delta I_{18}/\delta V_{IN} = 2\lambda_{18} V_{REF}\, \delta V_{OUT}/\delta V_{IN} \qquad 4$$

As $I_R$ is a constant, the current at the source node of FET's 16 and 18 is $$I_R = I_{16} + I_{18} \text{ and differentiating} \qquad 5$$

$$0 = \delta I_{16}/\delta V_{IN} + \delta I_{18}/\delta V_{IN} \qquad 6$$

Substituting equations 3 and 4 into equation 6, $$2\lambda_{16} V_{REF} + 2\lambda_{18} V_{REF}\, \delta V_{OUT}/\delta V_{IN} = 0$$

whereby $$\delta V_{OUT}/\delta V_{IN} = -\lambda_{16}/\lambda_{18} \qquad 7$$

and using equations (1-B) and (2-B)

$$\delta V_{OUT}/\delta V_{IN} = -(W/L)_{16}/(W/L)_{18} \qquad 8$$

This equation shows that the voltage gain of the circuit of FIG. 2 is set by the design of the geometries of FET's 16 and 18. Since these transistors can be located adjacent to each other so that the process-dependent variables are the same for each, the characteristics of the two FET's will be similar and the W/L ratio of equation 8 will be the only design variables needed to set a desired amplifier gain. Since these ratios can be designed to close tolerances, the $V_{OUT}/V_{IN}$ ratio can be accurately designed and will not vary appreciably from chip to chip even though the process parameters and individual FET characteristics vary substantially.

This description of a preferred embodiment of my invention is not to be taken as limiting the scope of the invention as set out in the following claims.

What is claimed is:

1. An amplifier for incorporation on a semiconductor chip with other circuits in integrated circuits, said amplifier having a high impedance to an input signal, a low current signal feedback circuit and having an overall signal gain substantially equal to a design value over a wide range of production parameters and including:

a high gain circuit having an input terminal, a reference voltage input terminal, and an output terminal, the signal on said output terminal being substantially larger than and inverted with respect to a signal applied to said input terminal;

a power supply having a positive voltage side, a negative voltage side and a reference zero level connection to said high gain circuit;

a constant current regulating device connected between said input terminal and the negative side of said power supply;

a first n-channel, depletion type field effect transistor having a source terminal connected to said input terminal, a drain terminal connected to the positive side of said power supply and a control terminal connected to a signal source; and a second n-channel, depletion type field effect transistor having a source terminal connected to said input terminal, a drain connection connected to the positive side of said power supply and a control terminal connected to said amplifier's output terminal; said second transistor having a width-to-length ratio different from the width-to-length ratio of said first transistor such that a gate voltage change which is the product of that of said first transistor multiplied by said value of said overall signal gain is required to produce the same change of current in said second transistor as is produced in said first transistor by said gate voltage change whereby, said constant current regulating device, said first field effect transistor, said second field effect transistor and said high gain circuit coact to maintain the voltage level of said input terminal at a virtual level essentially equal to said reference level voltage applied to said reference voltage input terminal.

* * * * *